(12) United States Patent
Miyata et al.

(10) Patent No.: US 12,211,872 B2
(45) Date of Patent: Jan. 28, 2025

(54) IMAGE CAPTURING ELEMENT AND IMAGE CAPTURING APPARATUS HAVING SPECTROSCOPIC ELEMENT ARRAY

(71) Applicant: Nippon Telegraph and Telephone Corporation, Tokyo (JP)

(72) Inventors: Masashi Miyata, Musashino (JP); Mitsumasa Nakajima, Musashino (JP); Toshikazu Hashimoto, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 17/762,298

(22) PCT Filed: Sep. 25, 2019

(86) PCT No.: PCT/JP2019/037677
§ 371 (c)(1),
(2) Date: Mar. 21, 2022

(87) PCT Pub. No.: WO2021/059409
PCT Pub. Date: Apr. 1, 2021

(65) Prior Publication Data
US 2022/0360759 A1  Nov. 10, 2022

(51) Int. Cl.
*H01L 27/146*  (2006.01)
*H04N 13/232*  (2018.01)
(Continued)

(52) U.S. Cl.
CPC .. *H01L 27/14625* (2013.01); *H01L 27/14621* (2013.01); *H01L 27/14627* (2013.01);
(Continued)

(58) Field of Classification Search
CPC ......... H01L 27/14621; H01L 27/14625; H01L 27/14627; H01L 27/1463; H04N 25/11; H04N 25/13
See application file for complete search history.

(56) References Cited

U.S. PATENT DOCUMENTS

2003/0156210 A1\* 8/2003 Wako .................... G01J 3/2823
348/273
2009/0115011 A1\* 5/2009 Ushiro .............. H01L 27/14621
257/E31.127
(Continued)

FOREIGN PATENT DOCUMENTS

CN 103907189 A 7/2014
EP 1936692 A1 6/2008
(Continued)

OTHER PUBLICATIONS

Seiji Nishiwaki, et al., *Efficient Colour Splitters for High-Pixel-Density Image Sensors*, Nature Photonics, vol. 7, Mar. 2013, pp. 240-246.
(Continued)

*Primary Examiner* — David N Werner
(74) *Attorney, Agent, or Firm* — Workman Nydegger

(57) ABSTRACT

An image capturing element according to the present disclosure includes a pixel array formed by a plurality of pixels arranged in an array on a substrate, each of the plurality of pixels including a photoelectric conversion element, a transparent layer formed on the pixel array, and a spectroscopic element array formed by a plurality of spectroscopic elements arranged in an array, and each of the plurality of spectroscopic elements is at a position corresponding to one of the plurality of spectroscopic elements inside or on the transparent layer. Each of the plurality of spectroscopic elements includes a plurality of microstructures formed from a material having a refractive index higher than a refractive
(Continued)

index of the transparent layer. The plurality of microstructures have a microstructure pattern. Each of the plurality of spectroscopic elements separates incident light into deflected light beams having different propagation directions according to the wavelength.

8 Claims, 13 Drawing Sheets

(51) Int. Cl.
H04N 23/10 (2023.01)
H04N 25/11 (2023.01)
H04N 25/13 (2023.01)
H04N 25/70 (2023.01)

(52) U.S. Cl.
CPC .... *H01L 27/1463* (2013.01); *H01L 27/14645* (2013.01); *H04N 13/232* (2018.05); *H04N 23/10* (2023.01); *H04N 25/11* (2023.01); *H04N 25/13* (2023.01); *H04N 25/70* (2023.01)

(56) References Cited

U.S. PATENT DOCUMENTS

| | | | | |
|---|---|---|---|---|
| 2010/0176473 | A1* | 7/2010 | Nishiwaki | H01L 27/14629 257/E31.127 |
| 2010/0201834 | A1* | 8/2010 | Maruyama | H01L 27/14636 257/E31.127 |
| 2010/0201855 | A1* | 8/2010 | Wada | H01L 27/14818 257/E31.127 |
| 2011/0164156 | A1* | 7/2011 | Hiramoto | H01L 27/14627 348/294 |
| 2011/0192962 | A1* | 8/2011 | Nishiwaki | H01L 27/14621 250/226 |
| 2014/0016012 | A1* | 1/2014 | Oishi | H01L 27/1463 348/311 |
| 2014/0284455 | A1 | 9/2014 | Hiramoto et al. | |
| 2015/0221693 | A1* | 8/2015 | Saitou | H01L 27/14645 257/432 |
| 2015/0318318 | A1 | 11/2015 | Nam et al. | |
| 2017/0092676 | A1 | 3/2017 | Yun et al. | |
| 2019/0157336 | A1 | 5/2019 | Kim et al. | |
| 2019/0196183 | A1* | 6/2019 | Yokogawa | G02B 13/16 |
| 2020/0021754 | A1* | 1/2020 | Borthakur | H01L 33/20 |
| 2020/0077055 | A1* | 3/2020 | Kim | H04N 25/11 |
| 2020/0388643 | A1* | 12/2020 | Ma | H01L 27/14645 |
| 2020/0411570 | A1* | 12/2020 | Noudo | H01L 27/1464 |
| 2021/0058574 | A1* | 2/2021 | Duan | H04N 25/11 |
| 2021/0091135 | A1* | 3/2021 | Yokogawa | H01L 27/14612 |

FOREIGN PATENT DOCUMENTS

| | | |
|---|---|---|
| JP | 2012-015424 A | 1/2012 |
| JP | 2014-138142 A | 7/2014 |
| KR | 10-2015-0125492 | 11/2015 |
| KR | 20170037452 | 4/2017 |
| KR | 20190056902 | 5/2019 |
| WO | WO2009/019818 A1 | 2/2009 |
| WO | WO2014/061173 A1 | 4/2014 |

OTHER PUBLICATIONS

Masashi Miyata, et al., *High-Sensitivity Color Imaging Using Pixel-Scale Color Splitters Based on Dielectric Metasurfaces*, ACS Photonics, Mar. 2019, pp. 1442-1450.

David Sell, et al., Periodic Dielectric Metasurfaces with High-Efficiency; Multiwavelength Functionalities, Advanced Optical Materials, vol. 5, 2017, 1700645, pp. 1-7.

* cited by examiner

Fig. 3
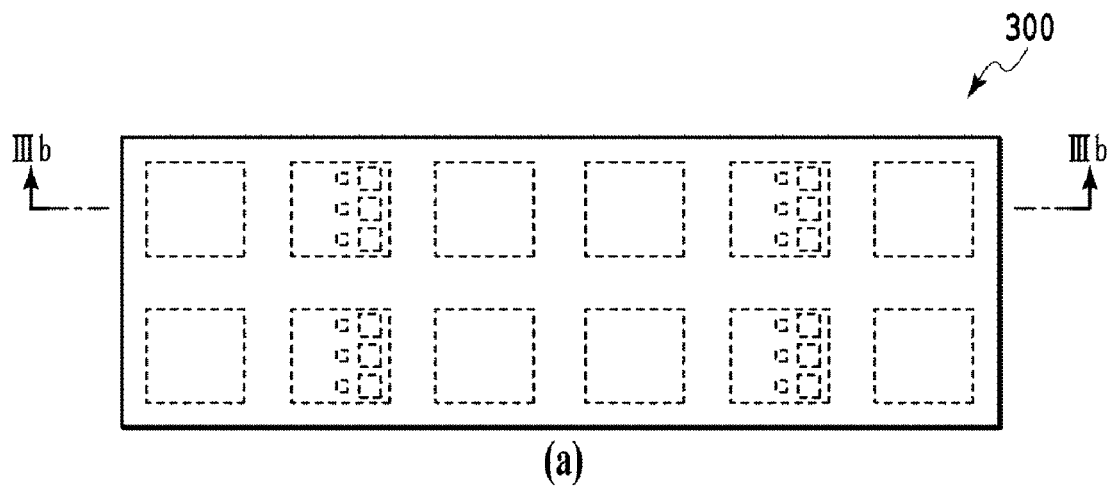
(a)
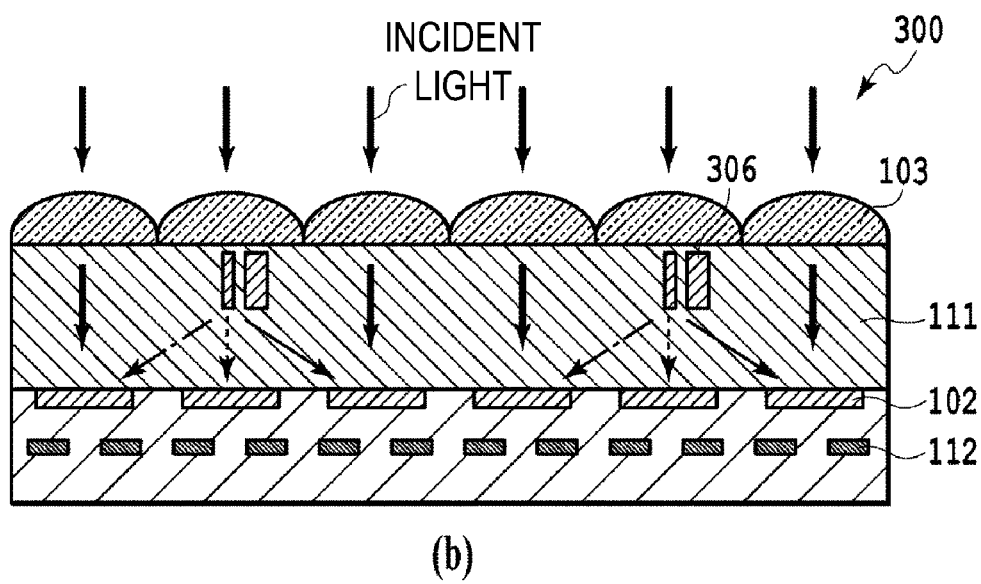
(b)

IMAGE CAPTURING ELEMENT AND IMAGE CAPTURING APPARATUS HAVING SPECTROSCOPIC ELEMENT ARRAY

TECHNICAL FIELD

The present invention relates to an image sensor and an image apparatus having an image sensor.

BACKGROUND ART

Generally, in an image capturing element having a photoelectric conversion element such as a Charge Coupled Device (CCD) sensor or a Complementary Metal Oxide Semiconductor (CMOS) sensor, color separation of incident light needs to be performed on each pixel including the photoelectric conversion element to acquire the color information to be captured.

FIG. 1 illustrates a cross-sectional view of a common color image capturing element. In a conventional color image capturing element 100, a photoelectric conversion element 102 is arranged on electrical wiring 112, and a color subtractive type color filter 104 made of an organic material or an inorganic material is arranged to face each pixel including the photoelectric conversion element 102. A microlens 103 is arranged on the color filter 104. When light is incident from the microlens 103, the color filter 104 transmits only the light in the desired wavelength band and absorbs or reflects the light in the undesired wavelength band. Consequently, signals are acquired from the three photoelectric conversion elements 102 corresponding to red (R), green (g), and blue (b) for each pixel, and a colored two-dimensional image can be generated.

However, in the common color image capturing element 100 as described above, in the case of incident light having a 1:1:1 ratio of RGB, there is a problem in that the total amount of light after transmission through the color filter 104 is inevitably about ⅓. The other light that is lost is the loss due to absorption or reflection by the color filter 104 and cannot be utilized to form the image. Thus, the light utilization efficiency of the incident light is about 30% at the maximum, and the sensitivity of the image capturing element is greatly limited. In recent years when pixels have become finer (higher resolution of images), the amount of light received by one pixel has inevitably decreased, and it is desirable to reduce the above-described limitation on the sensitivity of the image capturing element.

As an approach to reduce the limitation of sensitivity of the image capturing element, a color image capturing element including, instead of the color filter 104, a spectroscopic element such as a prism or dichroic mirror capable of separating the incident light according to the wavelength band has been proposed. In principle, such an approach can greatly reduce the loss of incident light, so that the light utilization efficiency can be significantly improved as compared with the case where the color filter 104 is used. However, in recent years when pixels have become finer, it is difficult to integrate spectroscopic elements such as prisms or dichroic mirrors on photoelectric conversion elements while maintaining their functions and characteristics.

Thus, in recent years, a color image capturing element including spectroscopic elements having microstructures that are relatively easy to integrate on a photoelectric conversion element has been proposed. In NPL 1, a method has been proposed for improving the light utilization efficiency by eliminating light loss during color separation in principle, through the use of two types of microstructures capable of separating the incident light into two wavelength regions.

FIG. 2(a) illustrates a top view of the color image capturing element 200 proposed in NPL 1, FIG. 2(b) illustrates a cross-sectional view along IIb-IIb, and FIG. 2(c) illustrates a cross-sectional view along IIc-IIc. As illustrated, in the color image capturing element 200, the incident light is separated into light that travels straight and light that deflects to the left and right according to the wavelength region by micro beam structures 206-1 and 206-2 arranged corresponding to the pixels (the photoelectric conversion elements 102), instead of the color filter 104. This is because the phase delay effect felt by the incident light in and around the micro beam structures varies largely in one wavelength region and is almost equal in the other wavelength region. Thus, by alternately arranging the two types of micro beam structures 206-1 and 206-2 having different structural thicknesses row by row on a two-dimensional pixel array, four photoelectric conversion elements 102 adjacent to each other are enabled to receive light with different wavelength components. As a result, a color image can be generated by performing signal processing using a matrix operation on the photoelectric conversion signal output from each photoelectric conversion element 102 and reproducing the color information.

In NPL 2, a method has been proposed for improving the light utilization efficiency by arranging binary microstructures having a constant thickness and capable of separating the incident light into three wavelength regions, above pixels (the photoelectric conversion element 102).

FIG. 3(a) illustrates a top view of a color image capturing element 300 having micro spectroscopic elements 306 proposed in NPL 2, and FIG. 3(b) illustrates a cross-sectional view along IIIb-IIIb. By using the color image capturing element 300 of NPL 2, a color image can be generated by color information reconstruction using signal processing, similarly to the case where the color image capturing element 200 of NPL 1 is used. Additionally, the light utilization efficiency of the color image capturing element 300 of NPL 2 is greater than the light utilization efficiency of the color image capturing element 200 of NPL 1. The color image capturing element 200 of NPL 2 has the advantage that there is no polarization dependency that was a problem in the color image capturing element 200 of NPL 1, and can be prepared easily because of the use of the binary structure.

CITATION LIST

Non Patent Literature

NPL 1: Seiji Nishiwaki, Tatsuya Nakamura, Masao Hiramoto, Toshiya Fujii, and Masaaki Suzuki, "Efficient colour splitters for high-pixel-density image sensors," Nature Photonics, Vol. 7, March 2013, pp 240-246

NPL 2: Masashi Miyata, Mitsumasa Nakajima, Toshikazu Hashimoto, "High-Sensitivity Color Imaging Using Pixel-Scale Color Splitters Based on Dielectric Metasurfaces," ACS Photonics, March 2019, pp 1442-1450

NPL 3: David Sell, Jianji Yang, Sage Doshay, Jonathan A. Fan, "Periodic Dielectric Metasurfaces with High-Efficiency; Multiwavelength Functionalities," Advanced Optical Materials, Vol. 5, 2017, 1700645

SUMMARY OF THE INVENTION

In NPLs 1 and 2, a color reconstruction method using signal processing has been proposed as a method for color image generation. However, the technology disclosed in NPLs 1 and 2 presents practical challenges. In these color image generation methods, there is a concern that a color error (noise) resulting from the signal processing may occur, and the signal-to-noise ratio (the SN ratio) of the image may deteriorate. Thus, even if the light utilization efficiency, that is, the amount of light received by the sensor is increased by the spectroscopic elements, there is a risk that the SN ratio of the captured image may not be improved due to the addition of new noise by signal processing, and the sensitivity may not virtually improve. Further, as the signal processing time is newly required, there is a risk that the temporal resolution of image capturing may be lowered. As disclosed in NPL 2, it is possible to consider a configuration in which color information is acquired directly from signal strength without using signal processing, by, for example, using an elliptic microlens in place of a common microlens having a perfect circle shape, or using a rectangular pixel in place of a square pixel commonly used. However, there is a lack of feasibility as changes in the shape of a lens or pixel are not likely to be compatible with the existing manufacturing process, post-stage processing, pixel placement, and the like, and there is a risk of disturbing the uniformity of the spatial resolution of the image.

The present disclosure has been made in view of the above-described problems, and an object of the present disclosure is to provide an image capturing element and an image capturing apparatus capable of generating an image with high sensitivity without using color reconstruction by signal processing.

To solve the above-described problems, an image capturing element according to an embodiment of the present invention includes a pixel array formed by a plurality of pixels arranged in an array on a substrate, each of the plurality of pixels including a photoelectric conversion element, a transparent layer formed on the pixel array, and a spectroscopic element array formed by a plurality of spectroscopic elements arranged in an array, and each of the plurality of spectroscopic elements is at a position corresponding to one of the plurality of pixels inside or on the transparent layer. In the image capturing element, each of the plurality of spectroscopic elements includes a plurality of microstructures formed from a material having a refractive index higher than a refractive index of the transparent layer, the plurality of microstructures have a microstructure pattern, and each of the plurality of spectroscopic elements separates incident light into deflected light beams having different propagation directions according to a wavelength and emits the deflected light beams.

According to an embodiment of the present invention, it is possible to realize an image capturing element capable of reducing the burden of signal processing of the color reconstruction and generating an image with high sensitivity, and an image capturing apparatus provided with the image capturing element. The generated image can be a color image based on a photoelectric conversion signal obtained by converting visible light incident on the image capturing element to an electrical signal. Alternatively, the generated image can be an image based on a photoelectric conversion signal obtained by converting infrared light or ultraviolet light incident on the image capturing element to an electrical signal. Thus, it is possible to reduce the concern about image deterioration due to signal processing and directly reflect the benefits of improving the light utilization efficiency by the micro spectroscopic elements in the improvement of image capturing sensitivity. In addition, the image capturing element according to an embodiment of the present invention has an advantage in that the image capturing element can be made using a widely used perfect circular microlens or a square pixel shape.

BRIEF DESCRIPTION OF DRAWINGS

FIG. 3(a) is a top view of a color image capturing element proposed in NPL 2 and FIG. 3(b) is a cross-sectional view along IIIb-IIIb.

FIGS. 11(a) to 11(c) are diagrams schematically illustrating an example of an arrangement of pixels including a photoelectric conversion element 102.

FIGS. 12(a) to 12(c) are diagrams schematically illustrating another example of an arrangement of pixels including a photoelectric conversion element 102.

DESCRIPTION OF EMBODIMENTS

Hereinafter, embodiments of the present invention will be described in detail with reference to the drawings. However, the following embodiments are merely examples, and the present invention is not limited to these embodiments.

Figure 4:
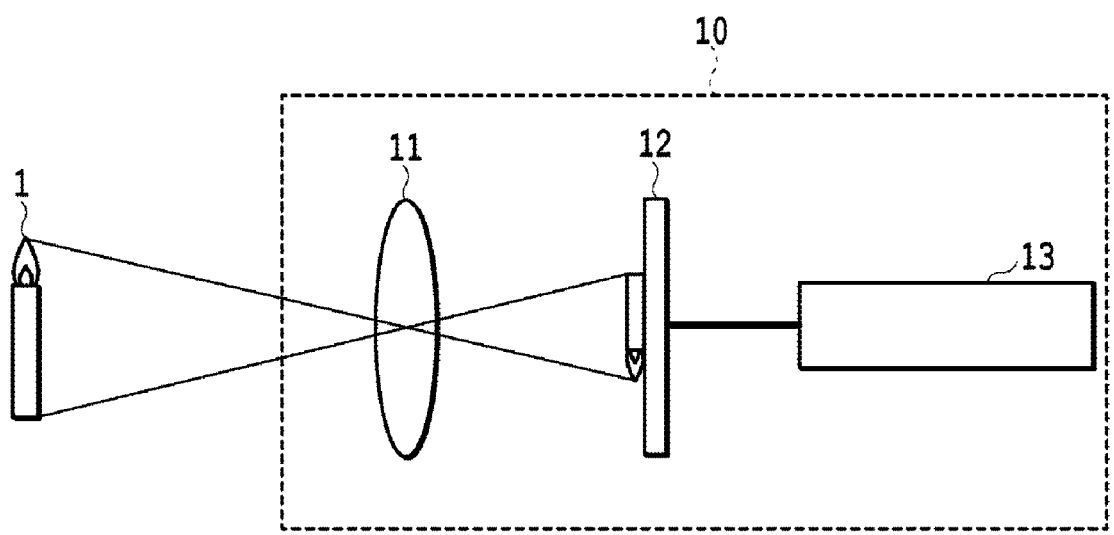
FIG. 4 is a side view illustrating a schematic configuration of an image capturing apparatus 10 according to an embodiment of the present invention.

FIG. 4 is a side view illustrating a schematic configuration of an image capturing apparatus 10 according to an embodiment of the present invention. The image capturing apparatus 10 includes a lens optical system 11, an image capturing element 12, and a signal processing unit 13 that processes the photoelectric conversion signal output from the image capturing element 12 to generate an image signal.

The light transmitted/reflected/scattered by an object 1 when the object 1 is irradiated with natural light, illumination light, or any other light, or the light emitted from the object 1 forms an optical image on the image capturing element 12 including a photoelectric conversion element such as a CCD or a CMOS, by the lens optical system 11. In general, the lens optical system is composed of a lens group consisting of multiple lenses aligned along the optical axis to correct various optical aberrations, but FIG. 4 is simplified so as to illustrate a single lens. The signal processing unit 13 includes a processor and is configured to process the photoelectric conversion signal output from the image capturing element 12 to generate an image signal, and includes an image signal output that transmits the generated image signal to the outside. It is noted that the image capturing apparatus 10 of the present invention may include known components such as an optical filter for cutting infrared light, an electronic shutter, a viewfinder, a power source (battery), a flashlight, and the like, but the descriptions of the components are omitted because they are not particularly necessary for understanding the embodiments of the present invention. Further, the configuration described above is merely an example, and in an embodiment of the present invention, the known elements can be appropriately combined and used for components excluding the lens optical system 11, the image capturing element 12, and the signal processing unit 13.

Before explaining the details of embodiments of the present invention, an outline of the image capturing element 12 in an embodiment of the present invention will be described. The image capturing element 12 of the embodiment of the present invention includes micro spectroscopic elements 101 and pixels including a photoelectric conversion element 102. A plurality of pixels including the photoelectric conversion elements 102 are arranged in two-dimensions to form a pixel array. In addition, a plurality of the micro spectroscopic elements 101 are arranged in two dimensions to face the pixels including the photoelectric conversion elements 102, and thus constitute a spectroscopic element array. Each of the plurality of pixels is provided at a position corresponding to each of the plurality of spectroscopic elements. The position corresponding to each of the spectroscopic elements includes, for example, a state in which each pixel of the pixel array overlaps a projection surface that is lowered to the pixel array in the vertical direction of the element surface from the area occupied by each of the spectroscopic elements.

Figure 5:
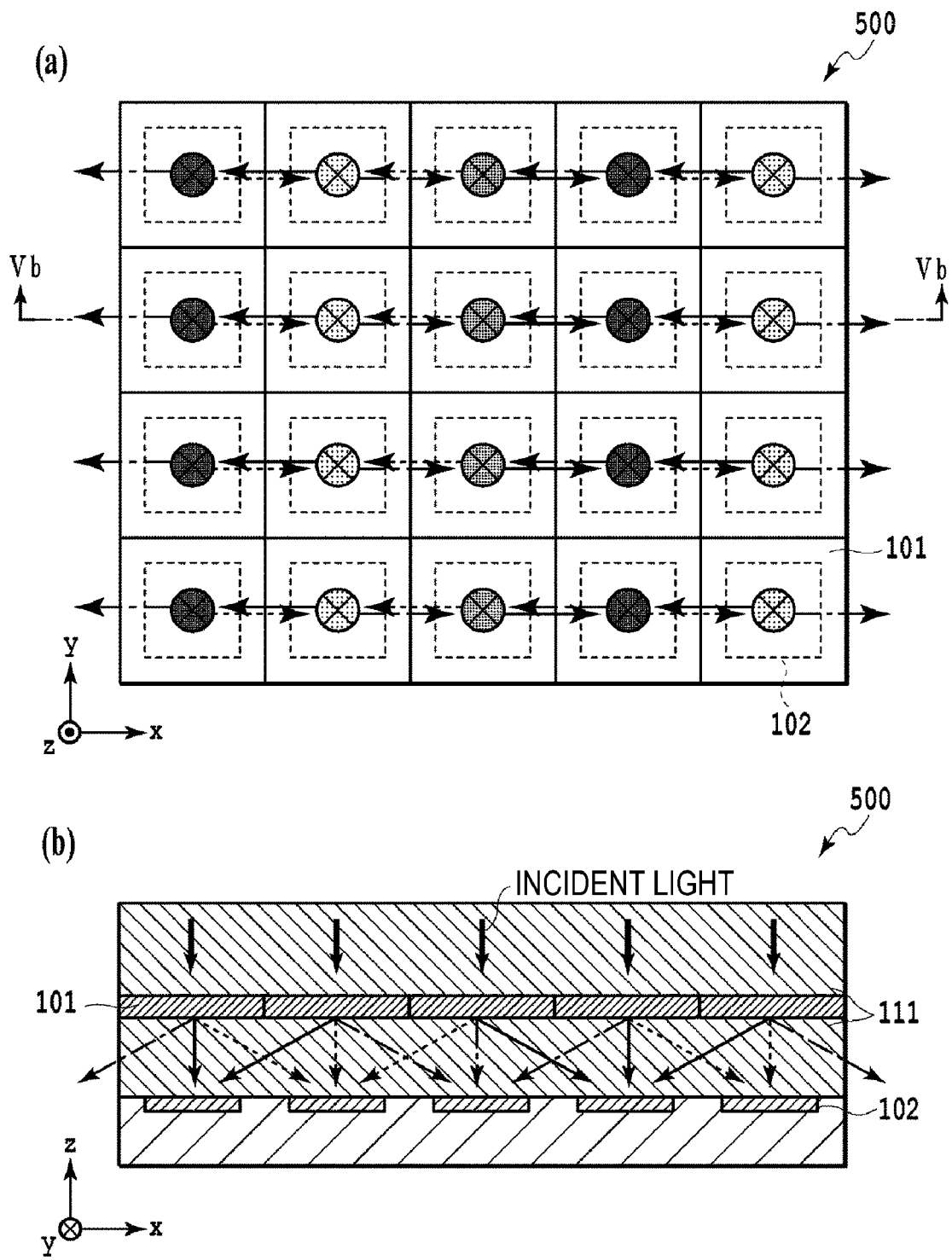
FIG. 5(a) is a diagram schematically illustrating a portion of a configuration of an image capturing element 500 including a pixel array and a spectroscopic element array, as viewed from a top surface.
FIG. 5(b) is a diagram schematically illustrating a cross-section along Vb-Vb in FIG. 5(a).

FIG. 5(a) schematically illustrates, as an example of the image capturing element 12, a portion of a configuration of an image capturing element 500 including the pixel array and the spectroscopic element array, as viewed from a top surface, and FIG. 5(b) schematically illustrates a portion of a configuration of the image capturing element 500 in the cross-section along Vb-Vb in FIG. 5(a). The spectroscopic element array faces the pixel array. The spectroscopic element array is arranged on the side where the light from the lens optical system 11 is incident. A transparent layer 111 is provided between the spectroscopic element array and the pixel array, and on the lens optical system 11 side of the spectroscopic element array. An electrical wiring 112 (not illustrated) is provided on the opposite side of the pixel array from the spectroscopic element array.

Each of the micro spectroscopic elements 101 constituting the spectroscopic element array has a microstructure pattern having a constant thickness (length in the y-axis direction). More specifically, each of the micro spectroscopic elements 101 has a microstructure pattern having a constant thickness and a shape of the top surface and the bottom surface different according to the position in the array. Details of the microstructure pattern will be described later. As for the thickness of the micro spectroscopic elements 101, microstructures may have varying thickness according to the position. The microstructure pattern is not limited and can take a variety of arrangement forms. The image capturing element 12 according to the embodiment of the present invention may include known components such as a microlens or a light-shielding wall, but the descriptions of the components are omitted in FIG. 5 because they are not particularly necessary for understanding the outline of the present invention.

According to the description of the present embodiment, the light incident on the image capturing element 12 is classified into separate wavelength regions, i.e., a first wavelength region, a second wavelength region, and a third wavelength region, but the present invention is not limited thereto. The combination of the first to third wavelength regions is generally the three primary colors of red (R), green (g), and blue (b), but is not limited thereto. For example, the combination of wavelength regions may be a combination of a plurality of different wavelength regions in the infrared light wavelength region, or a combination of a plurality of different wavelength regions in the ultraviolet light wavelength region. Each of the micro spectroscopic elements 101 constituting the spectroscopic element array in the embodiment of the present invention utilizes the phase delay effect caused by the microstructure described later, and the dependence of the phase delay effect on structural dimensions and wavelength. As a result, each of the micro spectroscopic elements 101 constituting the spectroscopic element array according to the embodiment of the present invention has a function of changing the propagation direction of the light incident on the image capturing element 12 for each of the first to third wavelength regions described above, and spatially separating the light above the pixel array. That is, in the embodiment of the present invention, the light incident on the image capturing element 12 is separated, by each of the micro spectroscopic elements 101, into three directions, namely a first direction (left), a second direction (straight), and a third direction (right) according to the wavelength region, and is incident on a plurality of pixels. As a more detailed example, a case is described where the micro spectroscopic elements 101 separate blue (B) in the first direction (left), green (G) in the second direction (straight), and red (R) in the third direction (right). The light in the wavelength region of blue (B) spreads in the x-axis direction and is incident on the pixel corresponding to blue (a left adjacent pixel to the pixel corresponding to green) as light having a wide width (light in which the wavelength components are aligned) (the angle of incidence of the short-wavelength light and the angle of incidence of the long-wavelength light are different). The light in the wavelength region of red (R) spreads in the x-axis direction and is incident on the pixel corresponding to red (a right adjacent pixel to the pixel corresponding to green) as light having a wide width (light in which the wavelength components are aligned) (the angle of incidence of the short-wavelength light and the angle of incidence of the long-wavelength light are different). The light in the wavelength region of green (G) does not spread in the x-axis direction and is incident on the pixel corresponding to green provided at a position corresponding to the micro spectroscopic element as light having a narrow width (the angle of incidence of the short-wavelength and the angle of incidence of the long-wavelength light are approximately equal).

Further, if three micro spectroscopic elements 101 adjacent to each other along a plane uniaxial direction (the x-axis direction of the xy plane) are considered as one spectroscopic unit, the spectroscopic functions of the three micro spectroscopic elements 101 constituting one spectroscopic unit are different from each other. Specifically, one spectroscopic unit includes three types of micro spectroscopic elements. For example, the first type of micro spectroscopic element has a spectroscopic function of separating the light in the first wavelength region, the second wavelength region, and the third wavelength region in the first direction (left), the second direction (straight), and the third direction (right), respectively. The second type of micro spectroscopic element has a spectroscopic function of separating the light in the first wavelength region, the second wavelength region, and the third wavelength region in the third direction (right), the first direction (left), and the second direction (straight), respectively. The third type of micro spectroscopic element has a spectroscopic function of separating the light in the first wavelength region, the second wavelength region, and the third wavelength region in the second direction (straight), the third direction (right), and the first direction (left), respectively.

Thus, by setting the distance between the micro spectroscopic element 101 and the pixel including the photoelectric conversion element 102 such that the light separated in the second direction (straight) by that micro spectroscopic element 101, the light separated in the first direction (left) by the micro spectroscopic element adjacent on the right side to that micro spectroscopic element 101, and the light separated in the third direction (right) by the micro spectroscopic element adjacent on the left side to that micro spectroscopic element 101 is incident on that photoelectric conversion element 102, each of the three pixels (the photoelectric conversion elements 102) directly under each spectroscopic unit receive only light in any of the first, second, and third wavelength regions. When light is incident on a pixel, the photoelectric conversion element 102 outputs an electric signal (the photoelectric conversion signal) depending on the intensity of the incident light, so that a signal corresponding to the wavelength region (the color information if the three primary colors are used) can be acquired directly. The above-described micro spectroscopic elements 101 and the plurality of pixels (the photoelectric conversion elements 102) corresponding to the micro spectroscopic elements 101 are arranged two-dimensionally, and thus, the information for each wavelength region of the optical image of an object formed by the lens optical system can be acquired at the same time without using special signal processing.

In the first embodiment described later, the first to third wavelength regions are set to the three primary colors of R, G, and B, and the incident light is spatially separated in three directions corresponding to the wavelength regions of R, G, and B by the micro spectroscopic elements 101. That is, almost all of the incident light is incident on the three pixels (the photoelectric conversion elements 102) directly under the spectroscopic unit in a state of being separated into the wavelength regions of R, G, and B. Thus, there is no large light loss, and color information can be directly acquired from the photoelectric conversion signal obtained from the pixels (photoelectric conversion elements 102).

Further, in the second embodiment described later, the first to third wavelength regions are set to the three primary colors of R, G, and B, and the micro spectroscopic elements 101 spatially separate the incident light in three directions corresponding to the wavelength regions of R, G, and B. Further, a light reduction type bandpass filter (the color filter 104) corresponding to each wavelength region of the separated light filters the light separated in three directions. That is, almost all of the incident light is incident on the three pixels (the photoelectric conversion elements 102) directly under the spectroscopic unit in a state of being separated into the wavelength regions of R, G, and B, and being filtered by a bandpass filter corresponding to each wavelength region. Thus, in the second embodiment as in the first embodiment, there is no large light loss, and the color information can be directly acquired from the photoelectric conversion signal obtained from the pixels (the photoelectric conversion elements 102). In addition, the effect of filtering improves the color reproducibility.

According to the image capturing element of the embodiment of the present invention, it is possible to acquire information for each wavelength region of the optical image of an object without a large light loss by light separation into each wavelength region using a micro spectroscopic element. That is, if the first to third wavelength regions are set to the three primary colors of R, G, and B, a color image can be acquired. Furthermore, as it is possible to directly acquire information for each wavelength region and it is not necessary to use color reconstruction based on signal processing, there is no concern about image deterioration due to color reconstruction that was a problem in the techniques disclosed in NPLs 1 and 2. Thus, it is possible to directly reflect the benefits of improving the light utilization efficiency by the micro spectroscopic elements in the improvement of image capturing sensitivity, and it is possible to increase the sensitivity of color image capturing as compared with the conventional image capturing elements using only the color filter. Furthermore, by using the micro spectroscopic element and the color filter together, it is possible to improve the color reproducibility while maintaining a higher light utilization efficiency as compared with the conventional image capturing elements using only the color filter. Also, in the image capturing element of the present invention, there is no need to change the commonly adopted microlens shape and pixel shape. This offers advantages that the compatibility with the existing manufacturing process and the image capturing system is high, and the effect can be obtained only by replacing the color filter included in the conventional image capturing element with the micro spectroscopic element.

Hereinafter, the embodiments of the present invention will be described in more detail with reference to the drawings.

First Embodiment

Hereinafter, an outline of a configuration of the image capturing element according to the present embodiment will be described. The present embodiment illustrates a configuration in which the incident light is separated into three wavelength regions (R, G, and B), but the number of wavelength regions to be separated and the wavelength in each of the wavelength regions are not limited thereto. For example, at least one of the three wavelength regions may correspond to light having a wavelength other than the three primary colors (for example, infrared light or ultraviolet light). The present embodiment illustrates the spectroscopic element array and the pixel array formed by the spectroscopic elements and the pixels arranged two-dimensionally, respectively, but the spectroscopic elements and the pixels may be each arranged one-dimensionally.

FIG. 6(a) schematically illustrates, as an example of the image capturing element 12, a portion of a configuration of an image capturing element 600 including the pixel array and the spectroscopic element array, as viewed from a top surface. FIG. 6(b) illustrates a portion of the configuration of the image capturing element 600 in the cross-section along Vb-Vb in FIG. 6(a). In the image capturing element 600, the transparent layer 111 having a low refractive index made of $SiO_2$ or the like and a plurality of microlenses 103 are laminated on a two-dimensional pixel array in which pixels including the photoelectric conversion element 102 are arranged in an array. The micro spectroscopic elements 101 are embedded inside the low refractive index transparent layer 111.

The micro spectroscopic elements 101 include a plurality of microstructures made of a material such as SiN or $TiO_2$ having a refractive index higher than that of the transparent layer 111. The plurality of microstructures are formed to have a microstructure pattern. For convenience, in the description below, an xyz orthogonal coordinate system is set in which a normal direction of the two-dimensional pixel array (an array of the photoelectric conversion elements 102) is considered as the z-axis, a horizontal direction parallel to the two-dimensional pixel array is considered as the x-axis, and a direction perpendicular to the x axis and parallel to the two-dimensional pixel array is considered as the y-axis.

As illustrated in FIGS. 6(a) and 6(b), the microlenses 103, the micro spectroscopic elements 101, and the pixels (the photoelectric conversion elements 102) are arranged in a grid pattern at a constant pitch on the xy plane to form arrays. One micro spectroscopic element 101 and one pixel (a photoelectric conversion element 102) are arranged directly below each of the microlenses 103. The micro spectroscopic element array is composed of the micro spectroscopic elements 101 that spatially separate, along a direction parallel to the x-axis on the plane, the incident light in the three directions (left, straight, right) corresponding to the three wavelength regions (R, G, B). Also, when the three micro spectroscopic elements 101 adjacent to each other along the x-axis are defined as one spectroscopic unit (indicated as dotted rectangles in FIG. 6(a)), the micro spectroscopic element array can be seen as an array of spectroscopic units in a grid pattern. The three micro spectroscopic elements 101 constituting the spectroscopic unit have different combinations of the three directions assigned to each of the three wavelength regions. Specifically, the spectroscopic unit has three types of micro spectroscopic elements including an element having a spectroscopic function of separating the R light (indicated by a solid line), the G light (indicated by a broken line), and the B light (indicated by a single point chain line) into left, straight, and right, respectively, an element having a spectroscopic function of separating the R light, the G light, and the B light into right, left, and straight, respectively, and an element having a spectroscopic function of separating the R light, the G light, and the B light into straight, right, and left, respectively.

In the above description, as an example, a case of a two-dimensional pixel array in which square pixels (the photoelectric conversion elements 102) are arranged in an orthogonal grid pattern has been described, but the pixel arrangement, shape, size, and the like are not limited to the example of the figure. In addition, although omitted in FIG. 6(b), between the two-dimensional pixel array and the micro spectroscopic element array, it is possible to provide a structure that operates as an internal microlens, acts to direct the light from the micro spectroscopic elements 101 to the photoelectric conversion element 102 in the pixels, has a condensing function using a relief structure, is made of SiN, $TiO_2$, or the like, and has a refractive index higher than that of a transparent layer. The structure may be a single plate having a refractive index higher than that of the transparent layer. The structure illustrated in FIGS. 6(a) and 6(b) can be manufactured by using semiconductor manufacturing technology.

The image capturing element 600 illustrated in FIGS. 6(a) and 6(b) has a back-illuminated structure in which light is incident from the opposite side of the wiring layer in which the electrical wiring 112 is formed. However, the present embodiment is not limited to such a structure, and may have, for example, a surface-illuminated structure that receives light from the side of the wiring layer.

Hereinafter, the function of each component of the image capturing element 600 according to the present embodiment will be described.

The white light incident on the image capturing element 600 is first focused by the microlens array, and almost all the light passes through the micro spectroscopic element 101 corresponding to each microlens 103. The light is spatially separated in three directions corresponding to the three wavelength regions by each of the micro spectroscopic elements 101, and is received by the three pixels (the photoelectric conversion elements 102) directly under each micro spectroscopic element 101. Due to the configuration of the spectroscopic unit, light in the wavelength region of any of the R, G, and B is incident on each pixel of the pixel array directly under the micro spectroscopic element array, so that each pixel handles the detection of the color information of any of the R, G, and B. Finally, photoelectric conversion is performed by the photoelectric conversion element 102 in each pixel, which is output as an image signal including the color information.

Between the pixel array and the micro spectroscopic elements, it is possible to provide a structure that operates as an internal microlens, is made of SiN, $TiO_2$, or the like, has a refractive index higher than that of a transparent layer, and has a condensing function using a relief structure, or a structure that is made of SiN, $TiO_2$, or the like, has a refractive index higher than that of a transparent layer, and has a condensing function using a single plate. However, the micro spectroscopic elements 101 described later can have a lens function depending on the phase delay distribution to be formed, and thus, it is possible to omit the internal microlens.

Hereinafter, the micro spectroscopic element 101 according to the present embodiment will be described. As described above, in order for the micro spectroscopic elements 101 to spatially separate the incident light along the three directions corresponding to the three wavelength regions (R, G, B), it is necessary to provide a different phase delay distribution for each wavelength region and change the light wave plane for the light transmitted through one micro spectroscopic element 101.

Figure 7:
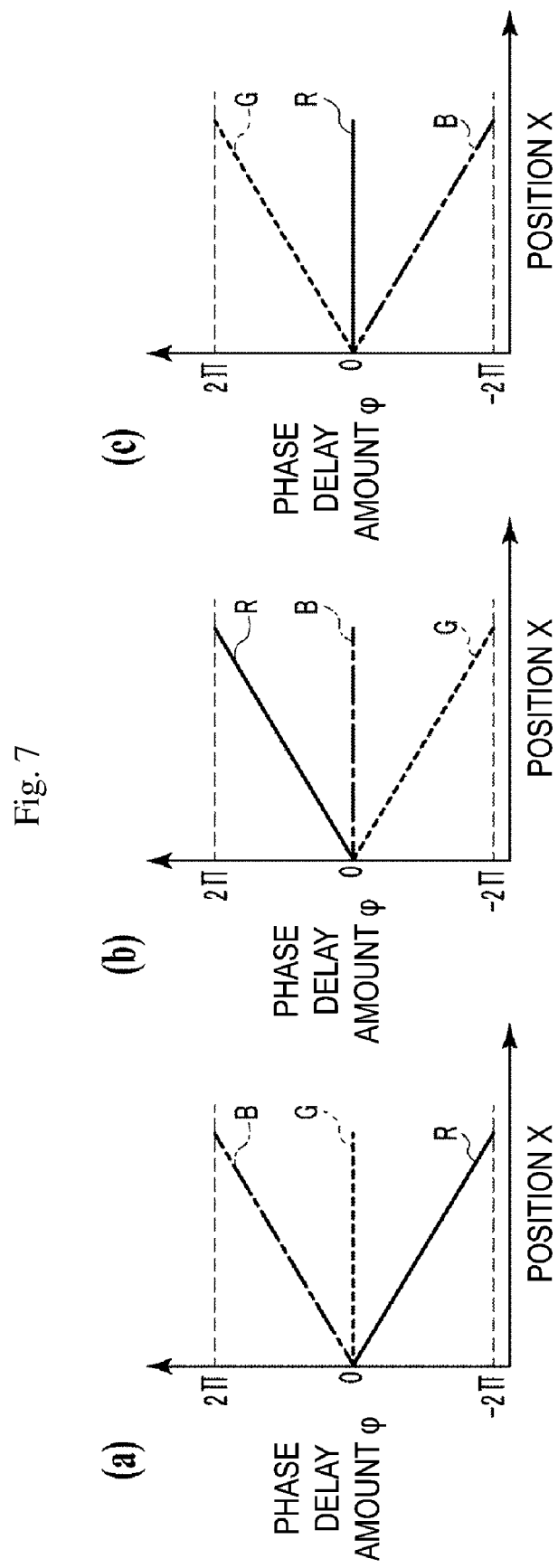
FIGS. 7(a) to 7(c) are diagrams showing examples of phase delay distributions that achieve spectroscopic characteristics for spatially separating incident light along three directions corresponding to the three wavelength regions (R, G, B).

FIG. 7(a) shows an example of a phase delay distribution that achieves spectroscopic characteristics for spatially separating incident light along three directions corresponding to the three wavelength regions (R, G, B). Here, in the phase delay distribution shown in FIG. 7(a), the phase delay distribution of the wavelength corresponding to the first wavelength region (R) is along a straight line in which the phase amount linearly decreases from 0 to −2π in a distance of one micro spectroscopic element in the x-axis direction, the phase delay distribution of the wavelength corresponding to the second wavelength region (G) does not change spatially, and the phase delay distribution of the wavelength corresponding to the third wavelength region (B) is along a straight line in which the phase amount linearly increases from 0 to +2π in a distance of one micro spectroscopic element in the x-axis direction. In this case, as for the light transmitted through the micro spectroscopic elements 101, R, G, and B can be efficiently propagated in the first direction (left), in the second direction (straight), and in the third direction (right), respectively. The above description is an example, and the combination of the wavelength region and the propagation direction can be freely changed depending on the phase delay distribution.

Thus, here, if a phase distribution as shown in FIG. 7(b), that is, a phase delay distribution in which the phase delay distribution of the wavelength corresponding to the second wavelength region (G) is along a straight line in which the phase amount linearly decreases from 0 to −2π in a distance of one micro spectroscopic element in the x-axis direction, the phase delay distribution of the wavelength corresponding to the third wavelength region (B) does not change spatially, and the phase delay distribution of the wavelength corresponding to the first wavelength region (R) is along a straight line in which the phase amount linearly increases from 0 to +2π in a distance of one micro spectroscopic element in the x-axis direction, is provided, R, G, and B can be efficiently propagated in the right direction, in the left direction, and in the straight direction, respectively.

Further, here, if a phase delay distribution as shown in FIG. 7(c), that is a phase distribution in which the phase delay distribution of the wavelength corresponding to the third wavelength region (B) is along a straight line in which the phase amount linearly decreases from 0 to −2π in a distance of one micro spectroscopic element in the x-axis direction, the phase delay distribution of the wavelength corresponding to the first wavelength region (R) does not change spatially, and the phase delay distribution of the wavelength corresponding to the second wavelength region (G) is along a straight line in which the phase amount linearly increases from 0 to +2π in a distance of one micro spectroscopic element in the x-axis direction, is provided, R, G, and B can be efficiently propagated in the straight direction, in the right direction, and in the left direction, respectively.

The phase delay distribution as described above can be realized by appropriately designing the material, number, shape, size, pattern, etc. of the microstructures as described later. That is, in the micro spectroscopic elements 101 of the present embodiment, the microstructures are arranged on a two-dimensional plane, different light wave planes are provided to the incident light according to the wavelength region, and the color components are spatially separated.

Figure 8:
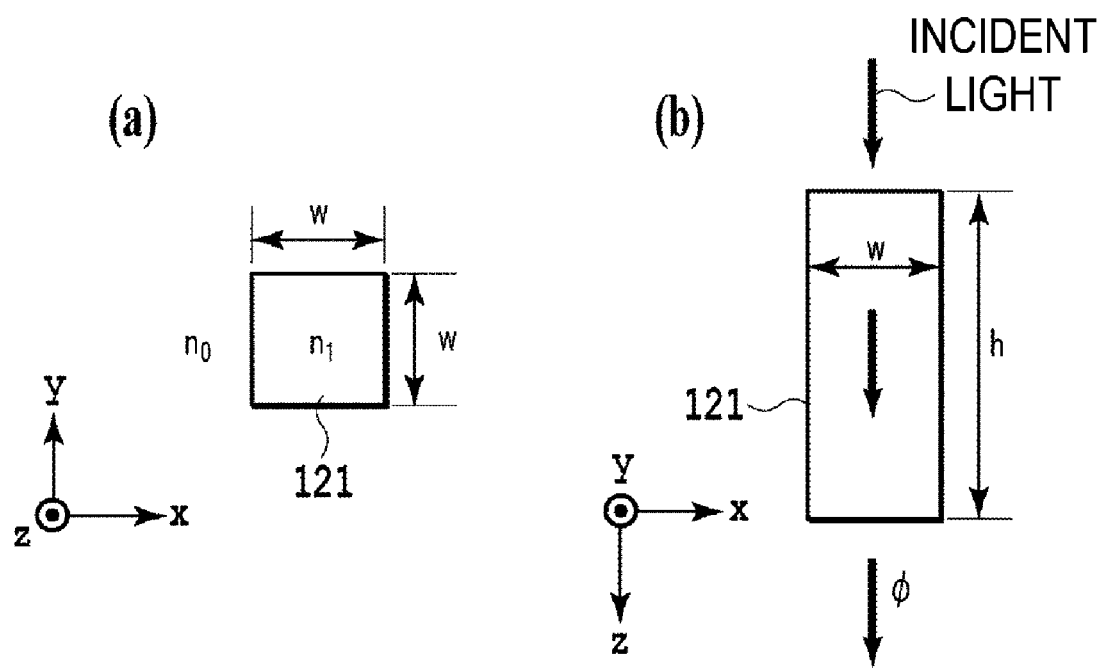
FIG. 8(a) is a top view of an example of a microstructure constituting a micro spectroscopic element 101 according to the present embodiment.
FIG. 8(b) is a side view of an example of a microstructure.

FIG. 8(a) illustrates a top view of an example of a microstructure constituting the micro spectroscopic element 101 according to the present embodiment, and FIG. 8(b) illustrates a side view of the microstructure. A columnar structure 121, which is an example of the microstructure, is formed of a material such as SiN or $TiO_2$ having a refractive index $n_1$ higher than the refractive index no of the transparent layer 111, and the thickness h of the structure is constant. The bottom surface and the top surface of the columnar structure 121 are square. The columnar structure 121 can be considered as an optical waveguide that confines light within the structure and propagates the light using the difference in refractive index between the transparent layer 111 and the columnar structure 121. Thus, the light incident from the top surface side propagates while being strongly confined within the columnar structure 121, experiences the phase delay effect determined by the effective refractive index $n_{eff}$ of the optical waveguide, and is output from the bottom surface side. Specifically, when the phase of light propagating through the transparent layer 111 by as much as the thickness of the structure is used as a reference, the phase delay amount φ due to the columnar structure 121 is represented by Equation 1 when the wavelength of light in a vacuum is set to λ.

$$\varphi=(n_{eff}-n_0)\times 2\pi h/\lambda \quad (1)$$

The phase delay amount φ varies depending on the wavelength λ of the light, and thus, it is possible to provide different phase delay amounts to the light according to the wavelength region (color component) in the same columnar structure 121. $n_{eff}$ is known to be a function of the width w of the columnar structure 121, and takes a value of $n_0<n_{eff}<n_1$. Thus, in the examples illustrated in FIGS. 8(a) and 8(b), it is possible to set various combinations of phase delay amounts according to the wavelength λ of light by changing the width w of the columnar structure 121. Moreover, the bottom surface and the top surface of the columnar structure 121 are square, and thus, optical characteristics including the phase delay effect do not change even when the polarization direction of the incident light is changed.

By arranging, on a two-dimensional plane, a plurality of the columnar structures 121 as described above, each having the width w set according to the position so as to conform to the phase delay distribution described above with reference to FIGS. 7(a) to 7(c), the micro spectroscopic element 101 according to the present embodiment can be realized. In the arrangement of each of the columnar structures 121 described above, in order to prevent the generation of unnecessary diffracted light due to the periodic structure, it is desirable to arrange the plurality of columnar structures 121 at intervals p equal to or less than the wavelength of the light. To efficiently deflect the light, a distribution in which the phase delay distribution changes from 0 to ±2π is suitable. Thus, in each wavelength region, the variable range of the amount of phase delay due to the columnar structure 121 is preferably 2π or higher. Thus, from Equation 1, assuming that the desired center wavelength in the wavelength region on the longest wavelength side of the wavelength region to be separated is λr, it is desirable to set the thickness h of the structure to $h=\lambda r/(n_1-n_0)$ or more. In the above example, a case where the bottom surface and the top surface of the columnar structure 121 are square has been described, but the shape is not limited to a square shape. That is, if the shaped surface includes four-fold rotational symmetry with the center of the surface as the axis of symmetry, the spectroscopic function does not depend on polarization, and the operation as an optical waveguide that results in the phase delay effect is not lost. Thus, it is desirable to adopt a columnar structure having four-fold rotationally symmetric surfaces such as a square, a hollow square, a circle, a hollow circle, and a cross shape.

Figure 9:
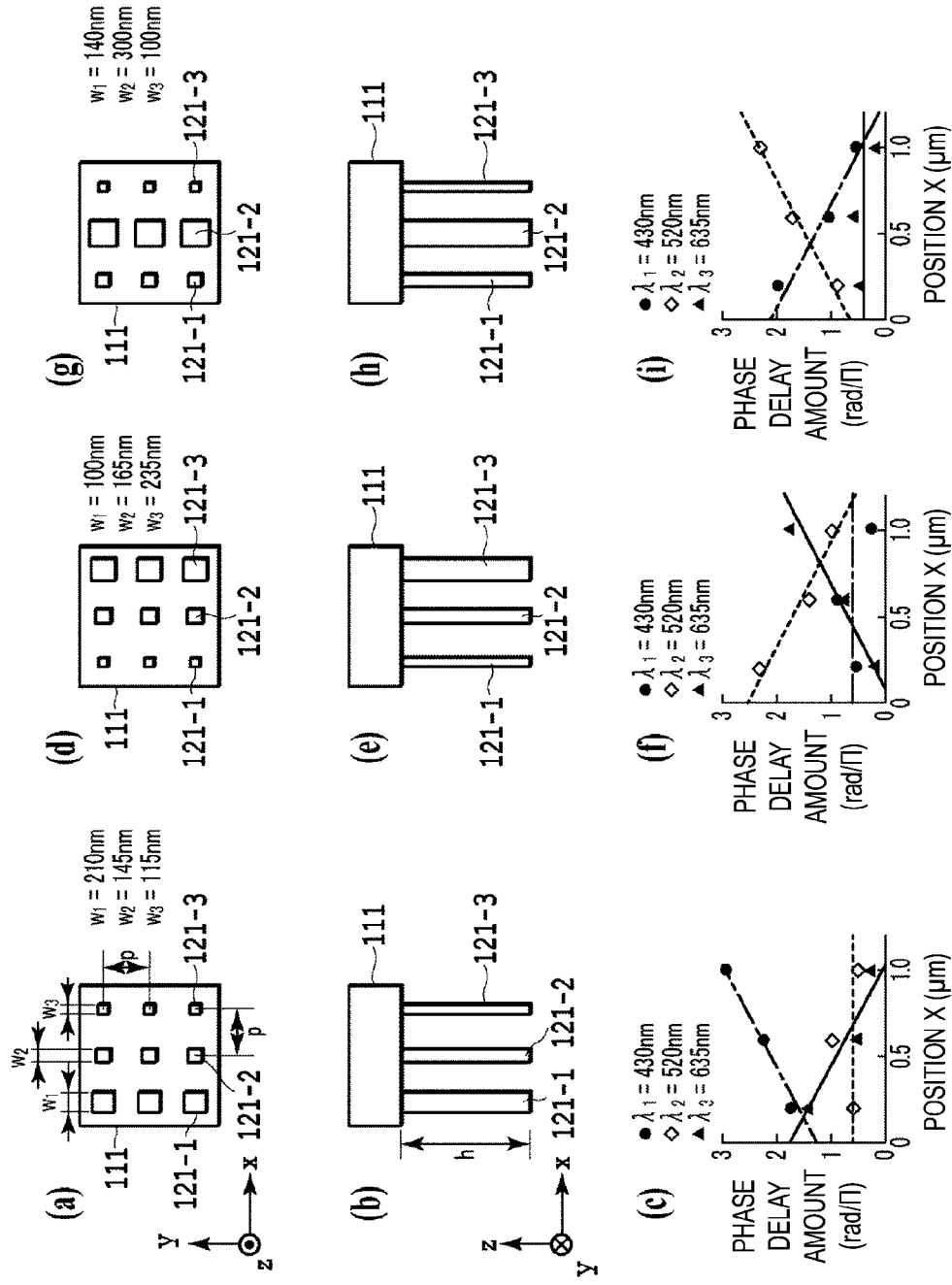
FIGS. 9(a), 9(d), and 9(g) are top views of an example of the micro spectroscopic elements 101 according to the present embodiment.
FIGS. 9(b), 9(e), and 9(h) are side views of the micro spectroscopic elements 101 corresponding to FIGS. 9(a), 9(d), and 9(g), and FIGS. 9(c), 9(f), and 9(i) are diagrams showing the phase delay distributions (plot) and the ideal phase delay distributions (line) for the micro spectroscopic elements 101 corresponding to FIGS. 9(a), 9(d), and 9(g).

A more detailed example of the micro spectroscopic elements 101 of the present embodiment will be described. FIGS. 9(a), 9(d), and 9(g) illustrate top views of an example of the micro spectroscopic elements 101 according to the present embodiment. FIGS. 9(b), 9(e), and 9(h) illustrate side views of an example of the micro spectroscopic elements 101 corresponding to FIGS. 9(a), 9(d), and 9(g). FIGS. 9(c), 9(f), and 9(i) show the phase delay distributions (plot) and the ideal phase delay distributions (line) for three wavelengths ($\lambda_1$=430 nm, $\lambda_2$=520 nm, $\lambda_3$=635 nm) for the micro spectroscopic elements 101 corresponding to FIGS. 9(a), 9(d), and 9(g). As illustrated, three columnar structures having different widths and a constant thickness (columnar structures having a microstructure pattern with a shape in which the widths of the top surface and the bottom surface differ according to the arrangement position) are arranged in the x-axis direction, and three columnar structures having the same width and a constant thickness are arranged in the y-axis direction, and these constitute one micro spectroscopic element 101. The material forming the columnar structure 121 is SiN ($n_1$=2.03). The material forming the transparent layer 111 on the columnar structure 121 is $SiO_2$ ($n_0$=1.45), and the material forming the transparent layer between the columnar structures 121 and the transparent layer under the columnar structure 121 (opposite to the transparent layer 111) is air ($n_0$=1.0). Instead of using the two types of transparent layers having different refractive indexes, the columnar structures 121 may be embedded in a single transparent layer. Here, an example in which three columnar structures are arranged will be described, but as long as a plurality of columnar structures are arranged, the number of columnar structures may not be three.

FIGS. 9(a), 9(d), and 9(g) illustrate an example of columnar structures 121 in which the bottom surface and the top surface are square. The thickness h of all the columnar structures 121 is 1250 nm, and the interval p between the structures in the x-axis and y-axis directions is 400 nm. Thus, the area of one element is 1.2 μm×1.2 μm. Under the conditions described above, the widths $w_1$, $w_2$, and $w_3$ of the three columnar structures 121-1, 121-2, and 121-3 are set according to the position so as to conform to the ideal phase delay distribution. As a result, it is possible to realize three types micro spectroscopic elements including an element having a spectroscopic function of separating the R, G, and B light into left, straight, and right, respectively ("RGB" (FIG. 9(a))), an element having a spectroscopic function of separating the R, G, and B light into right, left, and straight, respectively ("GBR" (FIG. 9(d))), and an element having a spectroscopic function of separating the R, G, and B light into straight, right, and left, respectively. ("BRG" (FIG. 9(g))). The value at the position x of the phase delay distribution is not required to become 0 as shown in FIGS. 7(a), 7(b), and 7(c), and thus, it is only required that the widths $w_1$, $w_2$, $w_3$, and the like are designed so that the positional relationship between the microstructures and the amount of phase delay for each wavelength are aligned in a straight line.

Figure 10:
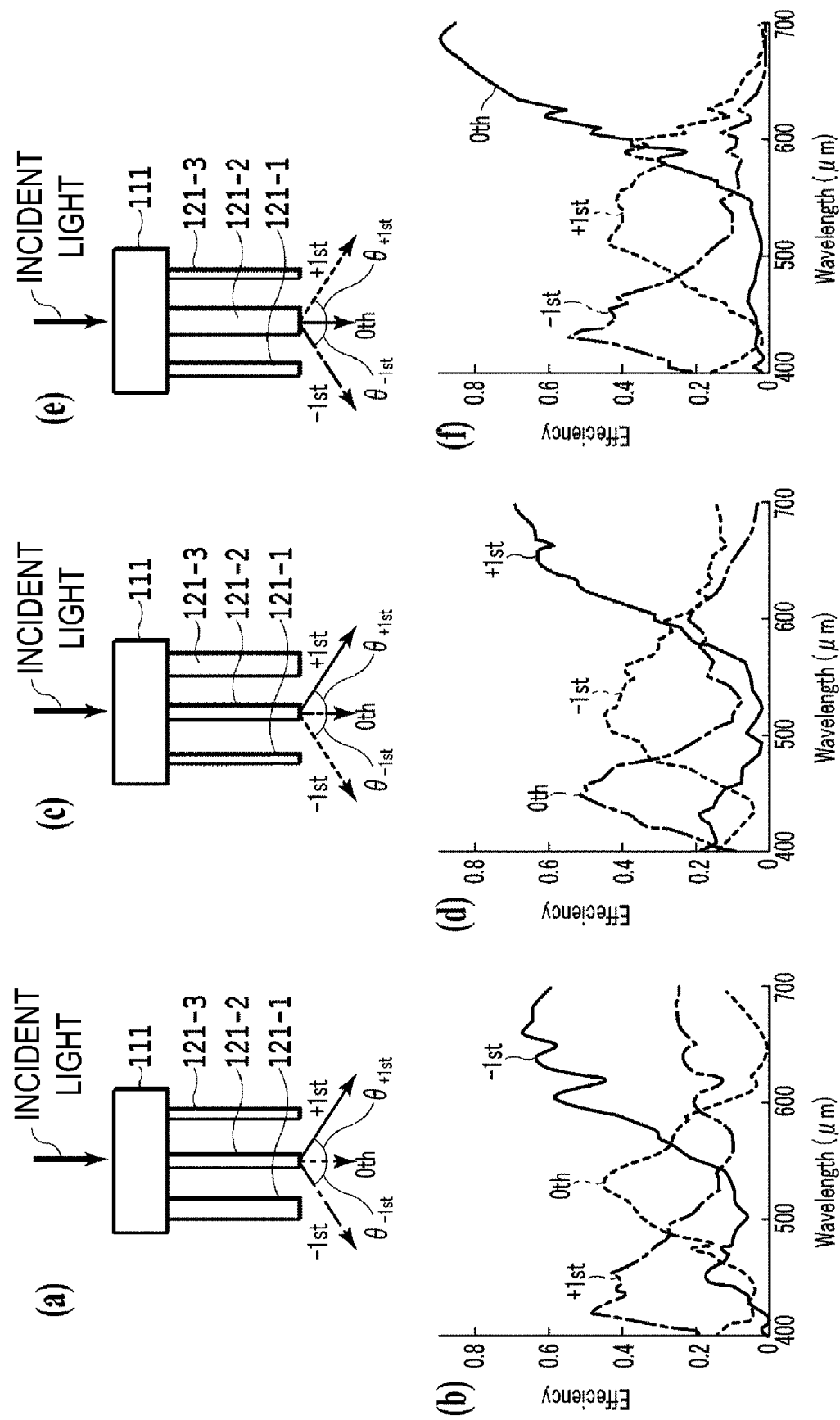
FIGS. 10(a), 10(c), and 10(e) are diagrams illustrating propagation of light in the micro spectroscopic elements 101 corresponding to FIGS. 9(b), 9(e), and 9(h), respectively.
FIGS. 10(b), 10(d), and 10(f) are diagrams showing the wavelength dependence of the efficiency of the spectroscopic function in the micro spectroscopic elements of FIGS. 10(a), 10(c), and 10(e).

FIGS. 10(a), 10(c), and 10(e) illustrate how parallel light incident from the top surface of the three types of micro spectroscopic elements 101 corresponding to FIGS. 9(b), 9(e), and 9(h) is separated into right (+1st), left (−1st), and straight (0th), and propagated. In addition, FIGS. 10(b), 10(d), and 10(f) show the wavelength dependence (the calculation result based on the rigorous coupled wave theory) of the efficiency of the spectroscopic function (the efficiency of propagation by separating in three directions (−1st, 0th, +1st) (the ratio of light intensity in each propagation direction with respect to the light intensity of incident light)) in the micro spectroscopic elements of FIGS. 10(a), 10(c), and 10(e). During calculation, it was assumed that the above-described micro spectroscopic elements 101 were arranged at intervals of P (P=3p) in the x-axis and y-axis directions, but it was confirmed that there was almost no difference from the optical function of a single micro spectroscopic element 101. The deflection angles $\theta_{-1st}$, $\theta_{0th}$, and $\theta_{+1st}$ for the three directions are based on the diffraction of light, and if the wavelength of light is assumed to be $\lambda$, the deflection angles are sin $\theta_{-1st}$=$\lambda$/P for left (−1st), $\lambda_{0th}$=0 for straight (0th), and sin $\theta_{+1st}$=$\lambda$/P for right (+1st).

The characteristics shown in FIGS. 10(b), 10(d), and 10(f) are comparable to the spectroscopic characteristics of a color filter in a conventional image capturing element. As can be seen from FIG. 10(b), the micro spectroscopic element illustrated in FIG. 10(a) (the "RGB" element) has an efficiency peak of the left (−1st) direction, in a red wavelength region of 600 nm or more, an efficiency peak of the straight (0th) direction, in a green wavelength region from 500 nm to 600 nm, and an efficiency peak of the right (+1st) direction, in a blue wavelength region of 500 nm or less. Similarly, as can be seen from FIG. 10(d), the micro spectroscopic element illustrated in FIG. 10(c) (the "GBR" element) has an efficiency peak of the left (−1st) direction, in a green wavelength region from 500 nm to 600 nm, an efficiency peak of the straight (0th) direction, in a blue wavelength region of 500 nm or less, and an efficiency peak of the right (+1st) direction, in a red wavelength region of 600 nm or more. Furthermore, as can be seen from FIG. 10(f), the micro spectroscopic element illustrated in FIG. 10(e) (the "BRG" element) has an efficiency peak of the left (−1st) direction, in a blue wavelength region of 500 nm or less, an efficiency peak of the straight (0th) direction, in a red wavelength region of 600 nm or more, and an efficiency peak of the left (−1st) direction, in a green wavelength region from 500 nm to 600 nm. It has been confirmed that the efficiency is 40 to 80%, which is a good spectral performance, and that the characteristics do not have a large polarization dependence. The total transmittance of light is 80% or more, and almost no light loss due to scattering or reflection occurs. From the above, it can be seen that the color components can be spatially separated with high efficiency by using the micro spectroscopic elements of the present embodiment. Further, in the above example, the size of a single micro spectroscopic element is 1.2 μm×1.2 μm, which is equivalent to the minimum pixel size of a common CMOS sensor. Thus, it is possible to form micro spectroscopic elements applicable to a pixel array formed by pixels having the smallest size currently available. It is also possible to form the micro spectroscopic elements 101 having different sizes depending on the size and number of the columnar structures 121 and the arrangement pattern.

Further, the micro spectroscopic element 101 in the present embodiment is not limited to the columnar structure 121 described above, and various forms of microstructures can be used. For example, a microstructure having a constant thickness with a structural pattern optimized by a computing device, as disclosed in NPL 3, can form a phase delay distribution for each wavelength region based on the same principle as described above, and can spatially separate the color components. According to Equation 1, it is possible to set a wider variety of combinations of phase delay amounts according to the wavelength $\lambda$ of light by changing the thickness h of the structure in addition to the structure width w. Thus, the micro spectroscopic elements in the present embodiment can also be realized by arranging, on a two-dimensional plane, a plurality of the microstructures, each having a width w and the thickness h set according to the position where the microstructure is arranged, so as to conform to the above-described phase delay distribution.

The micro spectroscopic element 101 having the above-described spectroscopic function can be manufactured by performing thin-film deposition and patterning by a known semiconductor manufacturing technique.

As described above, it is possible to provide the desired spectroscopic characteristics by appropriately designing the material, number, shape, size, pattern, and the like of the structures constituting the micro spectroscopic elements. As a result, as described above, light in a desired wavelength region can be separated and made incident on individual pixels, and a signal corresponding to the wavelength region can be acquired directly from the photoelectric conversion signal output from the photoelectric conversion element in each pixel. If the loss by the material forming the micro spectroscopic elements is low, almost no light loss occurs. Thus, the total amount of light reaching the pixel array can be dramatically increased as compared with the image capturing element using the conventional filter, and the sensitivity of color image capturing can be increased. Even if the spectroscopic performance of each micro spectroscopic element is somewhat different from the ideal performance described above, it is possible to obtain good color information by correcting and calculating the acquired signal according to the degree of difference in performance.

To minimize the optical crosstalk between pixels on a pixel array after the color components are separated by the micro spectroscopic elements, it is desirable that each separated light is incident on the vicinity of the center of each pixel. Thus, when the angle between the propagation direction of the light deflected by the micro spectroscopic elements and the normal direction of the pixel array is defined as θ and the period of the pixel array is defined as P, the interval between the output end of the micro spectroscopic elements and the photoelectric conversion element is preferably close to P/tan θ.

Hereinafter, the arrangement of the micro optical elements and pixels in the image capturing element of the present embodiment will be described.

Figure 6:
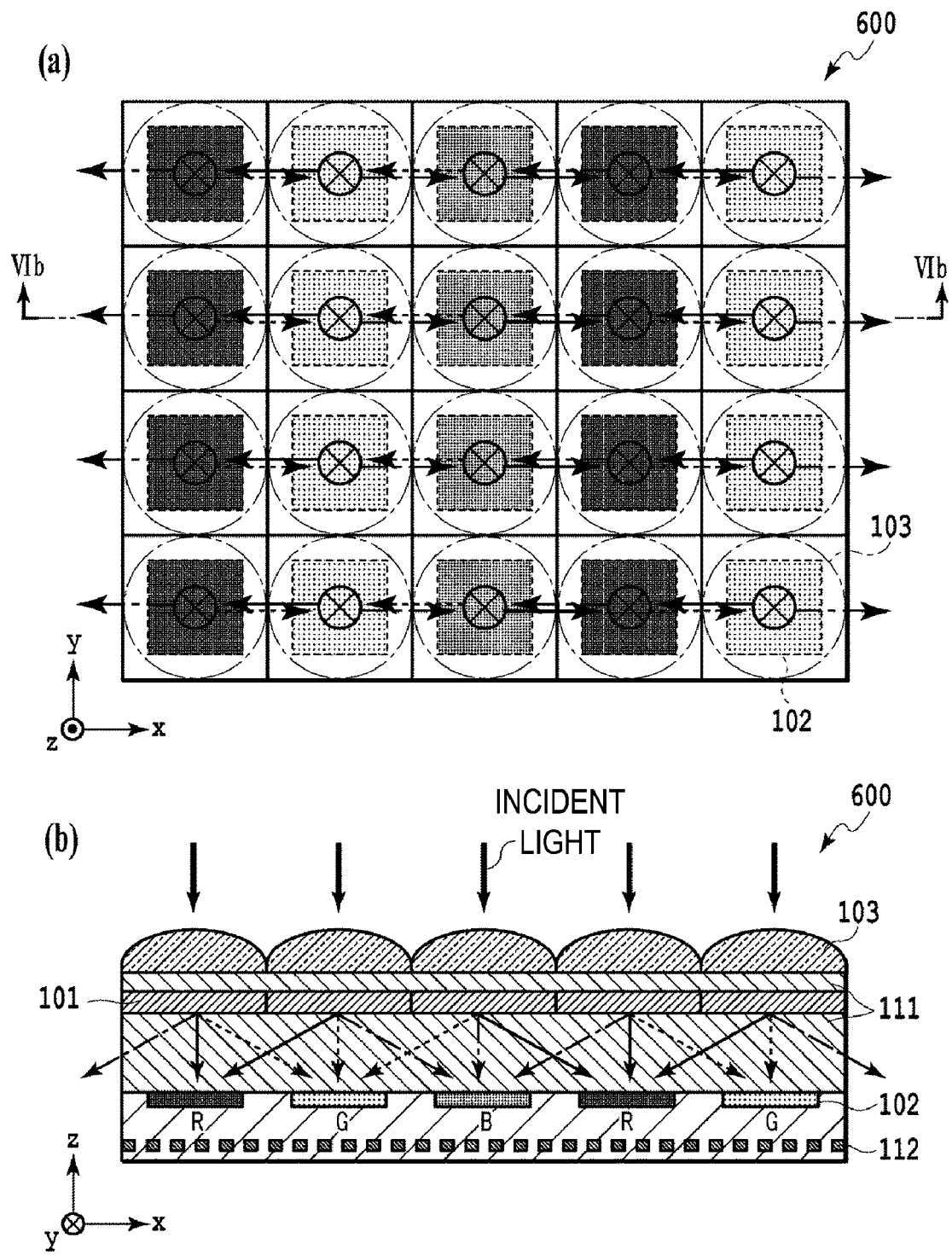
FIG. 6(a) is a diagram schematically illustrating a portion of a configuration of an image capturing element 600 including a pixel array and a spectroscopic element array, as viewed from a top surface.
FIG. 6(b) is a diagram schematically illustrating a cross-section along VIb-VIb in FIG. 6(a).

In the example illustrated in FIGS. 6(*a*) and 6(*b*), the rows of the micro spectroscopic elements 101 arranged along the x-axis direction are arranged repeatedly along the y-axis direction without shifting in the x-axis direction. As a result, the pattern of the micro spectroscopic elements is continuously arranged along the y-axis direction. In this case, in the x-axis direction, three pixels (the photoelectric conversion elements 102) each corresponding to the color component traveling straight downward (0th) with respect to each micro spectroscopic element are arranged in the order of R, G, and B from the left, and the sequence is repeatedly arranged.

Figure 11:
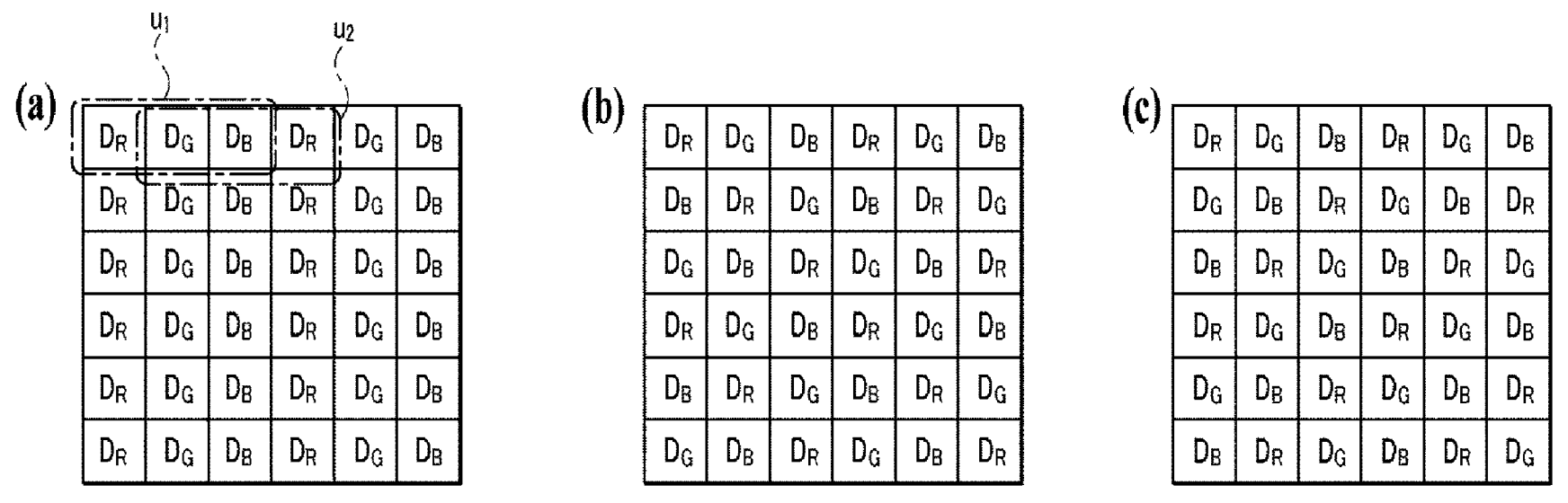

FIGS. 11(*a*) to 11(*c*) schematically illustrate an arrangement of pixels (the photoelectric conversion elements 102) corresponding to the color components described above. $D_R$ represents the pixel corresponding to R, $D_G$ represents the pixel corresponding to G, and $D_B$ represents the pixel corresponding to B. In this case, when three pixels adjacent in the x-axis direction are considered as one color pixel unit, a color pixel unit $u_1$ illustrated in FIG. 11(*a*) and a color pixel unit $u_2$, which is shifted in the x-axis direction by a single pixel with respect to the color pixel unit $u_1$, will both always include one pixel corresponding to each of R, G, and B. In other words, when color information is acquired while shifting the color pixel unit one pixel at a time in the xy plane, almost as much information of the three colors R, G, and B can be obtained as the number of pixels. This means that the resolution of the image capturing element can be increased to the extent of the number of pixels. Thus, the image capturing element 12 of the present embodiment can generate color information at a high resolution of a single pixel size in addition to having high sensitivity.

The arrangement of the micro optical elements and pixels that realize the resolution of the single pixel size as described above is not limited to FIG. 11(*a*), and can be changed in various ways. FIGS. 11(*b*) and 11(*c*) illustrate other examples in which the rows of the micro spectroscopic elements 101 and the color pixel units formed along the x-axis direction are sequentially arranged in the y-axis direction in a manner of being shifted in the x-axis direction by one-pixel size in FIG. 11(*b*) and two-pixel sizes in FIG. 11(*c*). With such an arrangement, similar to FIG. 11(*a*), color information can be generated at a resolution of a single pixel size.

Figure 12:
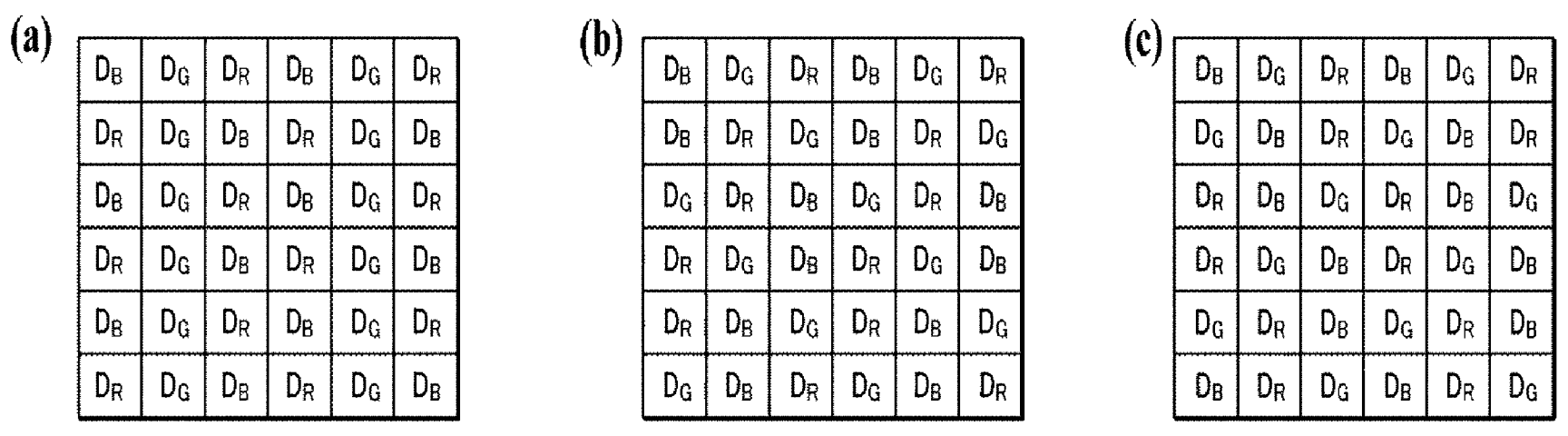

FIGS. 12(*a*) to 12(*c*) illustrate examples of arrangements different from those illustrated in FIGS. 11(*a*) to 11(*c*), where the order of the pixels $D_R$ corresponding to R, the pixels $D_G$ corresponding to G, and the pixels $D_B$ corresponding to B is reversed in the left-right direction in units of rows, and the shift in the x-axis direction is the same as in FIGS. 11(*a*) to 11(*c*), respectively. In this case as well, similar to FIG. 11(*a*), the color information can be generated at a resolution of a single pixel size. To reverse, in the left-right direction, the order of the pixels $D_R$, the pixels $D_G$, and the pixels $D_B$, a pattern obtained by reversing, in the left-right direction, the pattern of the columnar structures 121 of the micro spectroscopic elements 101 described above is used. It is also possible to generate a similar color information when BRG is used as the reference order of the pixel units, and similar to FIGS. 12(*a*) to 12(*c*), the order of the three pixels $D_B$, $D_R$, and $D_G$ is reversed in the left-right direction in units of rows and the pixel units are shifted in the x-axis direction. Similarly, it is also possible to generate a similar color information when GBR is used as the reference order of the pixel units, and similar to FIGS. 12(*a*) to 12(*c*), the order of the three pixels is reversed in the left-right direction in units of rows and the pixel units are shifted in the x-axis direction.

Second Embodiment

Next, an outline of a configuration of the image capturing element according to the second embodiment of the present invention will be described.

Figure 13:
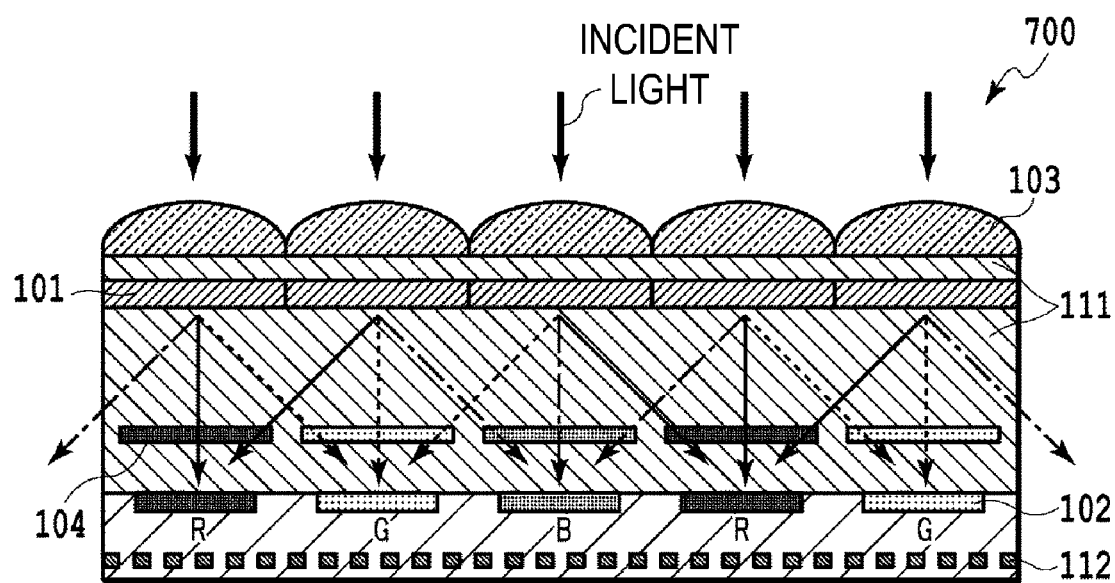
FIG. 13 is a diagram schematically illustrating a portion of a configuration in a cross-section of an image capturing element 700 including a pixel array and a spectroscopic element array.

FIG. 13 illustrates, as an example of the image capturing element 12, a portion of an outline in a cross-section of the image capturing element 700 of the present embodiment invention. As is clear from FIG. 13, the image capturing element 700 of the present embodiment differs from the image capturing element 600 of the first embodiment (FIG. 6(*b*)) in that the color filter 104 corresponding to each color component is arranged above a pixel (the photoelectric conversion element 102) corresponding to the color component. The other components are the same. Hereinafter, the differences from the image capturing element 600 of the first embodiment will be mainly described, and the overlapping points will be omitted.

Figure 1:
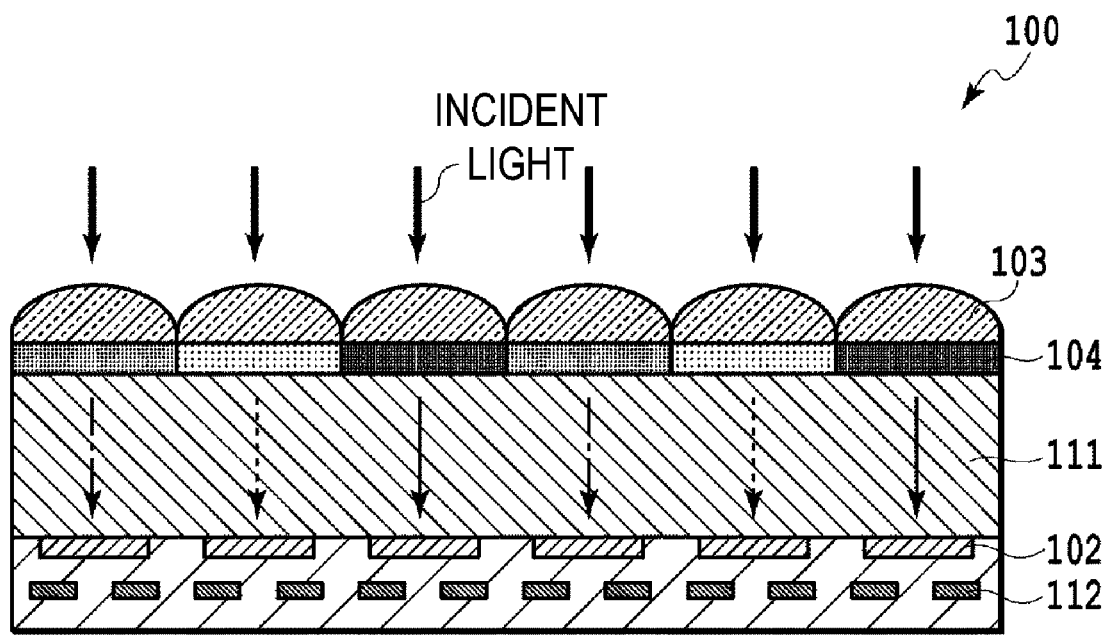
FIG. 1 is a cross-sectional view of a common color image capturing element.
Figure 2:
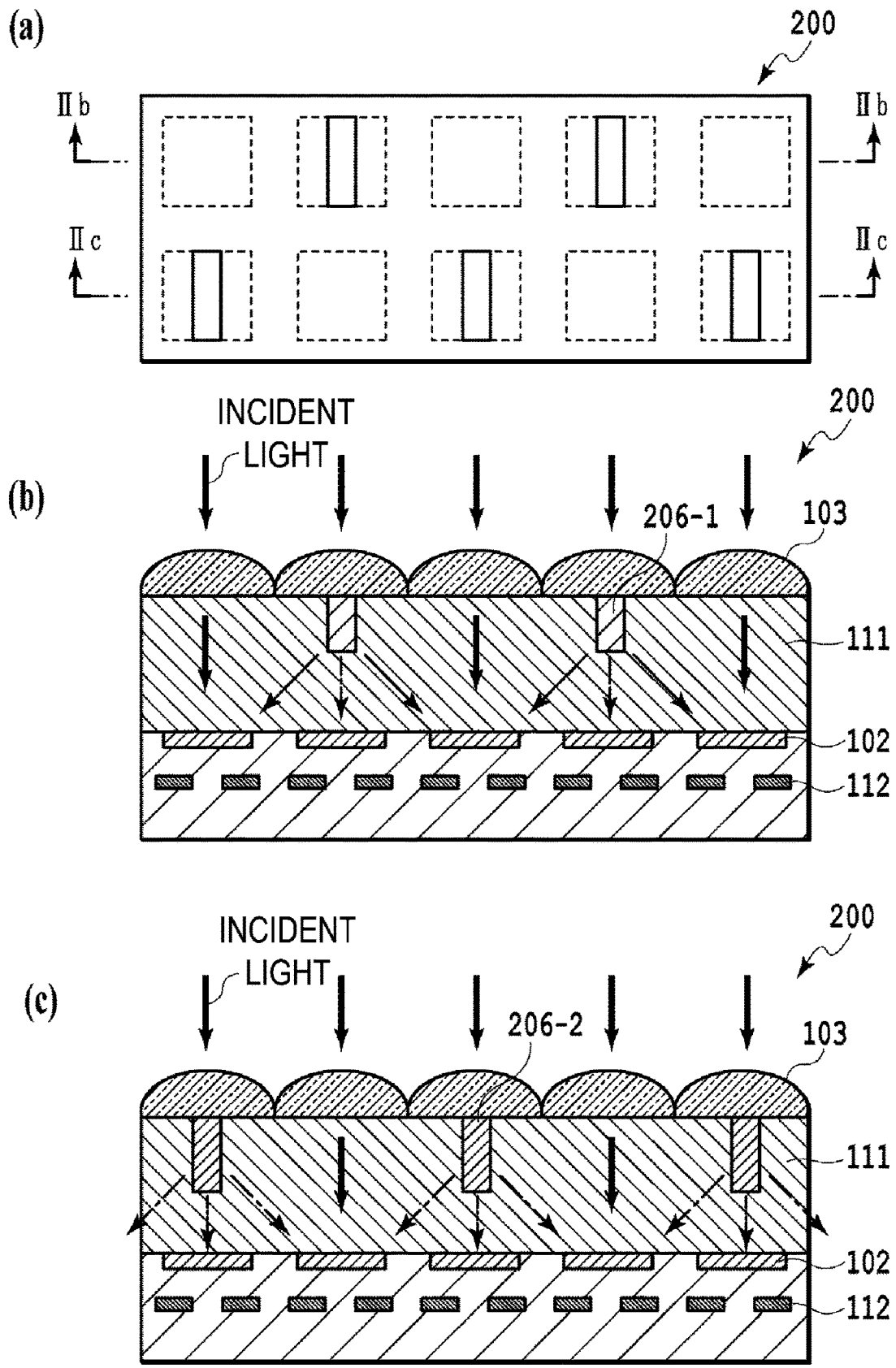
FIG. 2(a) is a top view of a color image capturing element proposed in NPL 1.
FIG. 2(b) is a cross-sectional view along IIb-IIb in FIG. 2(a)
FIG. 2(c) is a cross-sectional view along IIc-IIc in FIG. 2(a).

As illustrated in FIG. 13, the incident light is color-separated by the micro spectroscopic elements 101 and then filtered by the color filter 104 directly above the pixels. In this case, the light loss is small, and the light utilization efficiency of the image capturing element 700 is improved as compared with the configuration of only the color filter of the related art, because the light passes through the color filter 104 after color separation. On the other hand, the light needs to pass through two elements (the micro spectroscopic element 101 and the color filter 104), and thus the light utilization efficiency of the image capturing element 700 is reduced as compared with the image capturing element 600 of the first embodiment. Further, the incident light is affected by transmission characteristics that is a combination of the spectroscopic characteristics of the micro spectroscopic elements 101 and the filtering characteristics of the color filter 104, and thus the light reaching each pixel includes a smaller amount of unnecessary color components. Thus, the color reproducibility of the image capturing element 700 is greatly improved as compared with the color image capturing element 100 having only a color filter (FIG. 1) and the image capturing element 600 of the first embodiment. That is, it can be said that the image capturing element 700 has a configuration in which the light utilization rate and the color reproducibility are well-balanced.

From the above, in the configuration of the image capturing element 700 according to the present embodiment, the color information can be acquired with high sensitivity. Further, the filtering effect of the combined use with the color filter 104 has an advantage that the color reproducibility is improved. The present embodiment is the same as the first embodiment except for the above, has the same effect as that described in the first embodiment, and can be modified in the same manner.

The various embodiments and modifications of the embodiments described above are merely preferable specific examples of the present invention, and the present invention is not limited to the embodiments and modifications, and can be changed in various manners.

In the embodiments described above, an example in which SiN or $TiO_2$ is assumed as the material of the micro spectroscopic elements 101 is illustrated, but the present invention is not limited to the example. For example, when the image capturing element 12 is used for the visible light to near infrared region where the wavelength of light is in the range of 380 to 1000 nm, materials such as SiN, SiC, $TiO_2$, GaN, and the like having a high refractive index and low absorption loss are suitable for the material of the micro spectroscopic element 101. In addition, for near-infrared light having a wavelength in the range of 800 to 1000 nm, materials having low loss with respect to the light, such as Si, SiC, SiN, $TiO_2$, GaAs, GaN, and the like are suitable. For the near infrared region that is a waveband for longer wavelengths (communication wavelength of 1.3 μm, 1.55 μm, etc.), InP or the like can be used in addition to the above-described materials. When the micro spectroscopic elements 101 are formed by affixing, coating, polymers, and the like, including polyimides such as fluorinated polyimide or the like, BCB (benzocyclobutene), photocurable resins, UV epoxy resins, acrylic resins such as PMMA, and resists in general, can be used as materials.

Similarly, in the various embodiments described above and modifications of the embodiments, examples in which $SiO_2$ and air are assumed as the materials of the transparent layer 111 are described, but the present invention is not limited to the examples. Any material having a refractive index lower than that of the material of the micro spectroscopic element 101, and having a low loss with respect to the wavelength of the incident light, such as a common glass material, $SiO_2$, and air may be used. The transparent layer may have a laminated structure made of a plurality of materials.

In the various embodiments described above and modifications of the embodiments, a case where the light in the three wavelength regions supported by the micro spectroscopic elements 101 is the light of the three primary colors of red, green, and blue has been described, but at least one of the three wavelength regions may be light having a wavelength other than the three primary colors (for example, infrared light or ultraviolet light). For example, in a case where the micro spectroscopic elements 101 supporting the two primary colors of red and green are made, two types of micro spectroscopic elements created by changing the design of the microstructure pattern of the columnar structures of the three types of micro spectroscopic elements 101 described with reference to FIGS. 10(*a*) to 10(*c*) are used. For example, the two types of the micro spectroscopic elements include an element having a spectroscopic function of separating the R and G light beams into left and straight, respectively, and an element having a spectroscopic function of separating the G and R light into left beams and straight, respectively. In this case, below these elements, two pixels, that is, the pixel $D_R$ corresponding to red and the pixel $D_G$ corresponding to green, which are adjacent to each other in the x-axis direction and form a single color pixel unit, are arranged in a two-dimensional array. Similarly, the two types of the micro spectroscopic elements may include an element having a spectroscopic function of separating the G and B light beams into left and straight, respectively, and an element having a spectroscopic function of separating the B and G light beams into left and straight, respectively. In this case, below these elements, two pixels, that is, the pixel $D_G$ corresponding to green and the pixel $D_B$ corresponding to blue, which are adjacent to each other in the x-axis direction and form a single color pixel unit, are arranged in a two-dimensional array. Alternatively, the two types of the micro spectroscopic elements may include an element having a spectroscopic function of separating the B and R light beams into left and straight, respectively, and an element having a spectroscopic function of separating the R and B light beams into left and straight, respectively. In this case, below these elements, two pixels, that is, the pixel $D_B$ corresponding to blue and the pixel $D_R$ corresponding to red, which are adjacent to each other in the x-axis direction and form a single color pixel unit, may be arranged in a two-dimensional array.

Although the present invention has been described above based on specific embodiments, it goes without saying that the present invention is not limited to the above-described embodiments and can be variously modified without departing from the gist of the preset invention.

The invention claimed is:

1. An image capturing element, comprising:
 a pixel array formed by a plurality of pixels arranged in an array on a substrate, each of the plurality of pixels including a photoelectric conversion element;
 a transparent layer formed on the pixel array; and
 a spectroscopic element array formed by a plurality of spectroscopic elements arranged in an array, each of the plurality of spectroscopic elements being at a position corresponding to one of the plurality of pixels inside or on the transparent layer, wherein
 sets of the spectroscopic elements are repeatedly arranged along a first direction of the spectroscopic element array, each of the sets of the spectroscopic elements including N (N≥2) spectroscopic elements adjacent to each other along the first direction, and, in each of the sets of the spectroscopic elements, the N spectroscopic elements adjacent to each other have different microstructure patterns,
 wherein
 each of the plurality of spectroscopic elements includes a plurality of microstructures formed from a material having a refractive index higher than a refractive index of the transparent layer, the plurality of microstructures have a microstructure pattern, the plurality of microstructures are columnar structures, the plurality of microstructures have a cross section that is rotationally symmetric four times, and are separated from each other, and each of the plurality of spectroscopic elements separates incident light into deflected light beams having different propagation directions according to a wavelength, and emits the deflected light beams, and the different propagation directions according to wavelength between adjacent spectroscopic elements differ from each other.

2. The image capturing element according to claim 1, wherein

N is 3, wherein the different microstructure patterns in a set of three spectroscopic elements include, a first microstructure pattern formed by the columnar structures arranged in the order of the widest columnar structure, the second widest columnar structure, and the third widest columnar structure in an arrangement direction of the three micro spectroscopic elements, a second microstructure pattern formed by the columnar structures arranged in the order of the third widest columnar structure, the second widest columnar structure, and the widest columnar structure in the arrangement direction of the three micro spectroscopic elements, and a third microstructure pattern formed by the columnar structures arranged in the order of the second widest columnar structure, the widest columnar structure, and the third widest columnar structure in the arrangement direction of the three micro spectroscopic elements.

3. The image capturing element according to claim 1, wherein the plurality of microstructures in each of the plurality of spectroscopic elements have a constant thickness in a transmission direction of light.

4. The image capturing element according to claim 1, wherein the plurality of microstructures in each of the plurality of spectroscopic elements have varying thickness in a transmission direction of light, according to a position.

5. The image capturing element according to claim 1, wherein the deflected light beams emitted separately are incident on a first pixel, a second pixel, and a third pixel adjacent to each other of the plurality of spectroscopic elements, and when the incident light is white light, the light incident on the first pixel has a light intensity peak in a blue wavelength region being a wavelength region of 500 nm or less, the light incident on the second pixel has a light intensity peak in a green wavelength region being a wavelength region of 500 nm to 600 nm, and the light incident on the third pixel has a light intensity peak in a red wavelength region being a wavelength region of 600 nm or more.

6. The image capturing element according to claim 5, comprising:

a filter array between the pixel array and the spectroscopic element array, the filter array being formed by at least one type of filters arranged in an array.

7. The image capturing element according to claim 6, wherein the filter array is closer to the pixel array than the plurality of spectroscopic elements.

8. An image capturing apparatus, comprising:

the image capturing element according to claim 1;

an image capturing optical system for forming an optical image on an image capturing surface of the image capturing element; and a signal processing unit configured to process an electrical signal output by the image capturing element.

* * * * *